United States Patent
Wang

(10) Patent No.: US 9,977,159 B2
(45) Date of Patent: May 22, 2018

(54) SLIT GRATING, METHOD FOR MANUFACTURING THE SAME AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Junwei Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 92 days.

(21) Appl. No.: 14/424,670

(22) PCT Filed: Apr. 30, 2014

(86) PCT No.: PCT/CN2014/076562
§ 371 (c)(1),
(2) Date: Feb. 27, 2015

(87) PCT Pub. No.: WO2015/089978
PCT Pub. Date: Jun. 25, 2015

(65) Prior Publication Data
US 2016/0047954 A1    Feb. 18, 2016

(30) Foreign Application Priority Data

Dec. 18, 2013  (CN) .......................... 2013 1 0701254

(51) Int. Cl.
*G02B 5/18*    (2006.01)
*G02B 26/00*    (2006.01)
(Continued)

(52) U.S. Cl.
CPC ......... *G02B 5/1828* (2013.01); *G02B 5/1842* (2013.01); *G02B 26/004* (2013.01);
(Continued)

(58) Field of Classification Search
CPC .............. G02B 27/2214; G02B 5/1814; G02B 5/1866; G02B 5/1861; G02B 27/225;
(Continued)

(56) References Cited

U.S. PATENT DOCUMENTS

2009/0059348 A1 *   3/2009   Niwano ............... G02B 26/004
                                                                 359/296
2011/0140996 A1     6/2011   Parry-Jones
(Continued)

FOREIGN PATENT DOCUMENTS

CN   101355838 A   1/2009
CN   101389995 A   3/2009
(Continued)

OTHER PUBLICATIONS

International Search Report and Written Opinion dated Sep. 28, 2014 regarding PCT/CN2014/076562. Translation provided by Dragon Intellectual Property Law Firm.
(Continued)

*Primary Examiner* — Thomas K Pham
*Assistant Examiner* — Alberto Betancourt
(74) *Attorney, Agent, or Firm* — Harness, Dickey & Pierce, P.L.C.

(57) ABSTRACT

The present disclosure relates to a slit grating, a method for manufacturing the same and a display device. The slit grating includes an upper substrate, a lower substrate, an electric-controlled dielectric layer and a liquid composite layer arranged between the upper substrate and the lower substrate. The liquid composite layer consists of a light-shielding liquid and a light-transmitting liquid incompatible with each other. The electric-controlled dielectric layer has an electrically-induced light-shielding-liquid-philic or light-shielding-liquid-phobic property.

17 Claims, 4 Drawing Sheets

(51) Int. Cl.
*G03F 7/20* (2006.01)
*G03F 7/00* (2006.01)
*G02F 1/17* (2006.01)
*G02B 27/22* (2018.01)

(52) U.S. Cl.
CPC ....... *G02B 26/005* (2013.01); *G02B 27/2214* (2013.01); *G02F 1/17* (2013.01); *G02F 1/176* (2013.01); *G03F 7/0005* (2013.01); *G03F 7/2022* (2013.01); *G02F 2202/01* (2013.01); *G02F 2202/04* (2013.01)

(58) Field of Classification Search
CPC .. G02B 5/1828; G02B 5/1842; G02B 5/1847; G02B 5/1857; G02B 5/203; G02B 26/004; G02B 26/007; G02B 26/00; G02B 26/005; G02B 26/001; G02B 26/02; G02B 26/08; G02B 26/0808; G02B 26/0816; G02B 26/0875; G02B 26/026; H04N 13/0497; C23C 14/08; C23C 14/081; C23C 16/12; C23C 16/20; C23C 16/40; C23C 16/403; C23C 18/10; C23C 2/12; C23C 18/1216; C23C 4/01; C23C 4/10; C23C 4/11; H05K 1/092; H05K 2201/03; G09G 3/16; G09G 3/18; G09G 3/19; G09G 3/34; G09G 2310/068; G09G 3/344; G09G 3/3446; G09G 3/3453
USPC ........ 359/252–253, 254–256, 228, 291, 297, 359/296; 349/1–18, 56, 73–83, 84–108; 345/204–215, 48, 84, 107; 427/126.4, 427/126.3
See application file for complete search history.

(56) References Cited

U.S. PATENT DOCUMENTS

| | | | |
|---|---|---|---|
| 2013/0162610 A1* | 6/2013 | Cho | G09G 5/10 345/205 |
| 2013/0229407 A1 | 9/2013 | Chiu et al. | |
| 2013/0301106 A1* | 11/2013 | Jon | G02B 26/005 359/290 |
| 2014/0036341 A1* | 2/2014 | Kwon | G02B 26/005 359/290 |
| 2014/0097395 A1* | 4/2014 | Khan | H01L 51/102 257/1 |
| 2014/0132724 A1* | 5/2014 | Choi | H04N 13/0235 359/290 |

FOREIGN PATENT DOCUMENTS

| | | |
|---|---|---|
| CN | 102937744 A | 2/2013 |
| CN | 103033982 A | 4/2013 |
| CN | 103033996 A | 4/2013 |
| CN | 103698828 A | 4/2014 |
| JP | 2013-218070 A | 10/2013 |
| KR | 20070097815 A | 10/2007 |

OTHER PUBLICATIONS

Chinese Office Action dated Jun. 3, 2015 regarding Chinese Application No. 201310701254.1 Translation provided by Dragon Intellectual Property Law Firm.

Luo, Mingxiang et al., "Modulating Contact Angle Hysteresis to Direct Fluid Droplets Along a Homogenous Surface", Applied Materials and Interfaces, 2012, 4, pp. 890-896.

European Search Report regarding Application No. 14859329.6-1562 / 3086157, dated Aug. 3, 2017. Translation provided by Dragon Intellectual Property Law Firm.

* cited by examiner

SLIT GRATING, METHOD FOR MANUFACTURING THE SAME AND DISPLAY DEVICE

CROSS-REFERENCE TO RELATED APPLICATIONS

The present application is the U.S. national phase of PCT Application No. PCT/CN2014/076562, filed on Apr. 30, 2014, which claims priority to Chinese Patent Application No. 201310701254.1, filed on Dec. 18, 2013, the disclosures of which are incorporated in their entirety by reference herein.

TECHNICAL FIELD

The present disclosure relates to the field of display technology, in particular to a slit grating, a method for manufacturing the same and a display device.

BACKGROUND

For an existing three-dimension (3D) display technology, usually a parallax baffle 20' (i.e., a slit grating) is arranged at a display side of a display panel 10', so as to achieve the 3D display. FIG. 1 shows the principle thereof, in which the parallax baffle 20' has slit gratings, and images of pixels on the display panel 10' are transmitted to a viewpoint through the slits on the parallax baffle 20'. As shown in FIG. 1, at the viewpoint, different pixels on the display panel 10' may be observed by a viewer's left eye 12' and right eye 11', so that the viewer can merely observe a left-eye image by the left eye and the a right-eye image by the right eye at the viewpoint. The left-eye and right-eye images are then combined in the viewer's brain to obtain a stereo effect.

Along with the development of the market, a 2D/3D switchable display device appears. In order to switch between a 2D display mode and a 3D display mode, a liquid crystal slit grating is a most commonly used technique. As a shown in FIG. 2, the liquid crystal slit grating may be a TN-mode liquid crystal panel and include, from top to bottom, an upper polarizer 30', an upper substrate 100' and a lower substrate 200' arranged oppositely to each other to form a cell, a lower polarizer 31', and a liquid crystal layer 60' arranged between the upper substrate 100' and the lower substrate 200'. The upper polarizer 30' is of a polarization direction identical to the lower polarizer 31'. A plurality of parallel, bar-like transparent electrodes 40' are formed at a surface of the upper substrate 100' close to the liquid crystal layer 60', and a gap between the adjacent transparent electrodes 40' meets the requirement of the slit grating for autostereoscopic 3D display. Plate-like transparent electrode 41' are formed at an entire surface of the lower substrate 200' close to the liquid crystal layer 60'. The bar-like transparent electrodes 40' and the plate-like transparent electrodes 41' are electrically connected to two ends of a power source 50', respectively, and a switch 70' is provided so as to control whether or not to apply voltages to the bar-like transparent electrodes 40' and the plate-like transparent electrodes 41'. To be specific, when the switch 70' is turned on and no voltage is applied to the bar-like transparent electrodes 40' and the plate-like transparent electrodes 41', liquid crystal molecules of the liquid crystal layer 60' are not deflected so as to allow the transmission of the light therethrough, thereby to achieve the 2D display. When the switch 70' is turned off and the voltages are applied to the bar-like transparent electrodes 40' and the plate-like transparent electrodes 41', the liquid crystal molecules at a region corresponding to the bar-like transparent electrodes 40' are deflected so as to form light-shielding stripes through which the light cannot be transmitted. At this time, the light can merely be transmitted through light-transmitting stripes between the bar-like electrodes, so as to achieve the 3D display.

However, the process for manufacturing the liquid crystal slit grating is complex, and the production cost thereof is relatively high, so it is adverse to lightening and thinning of the 2D/3D switchable display device as well as the promotion thereof. In addition, the polarizers provided in the liquid crystal slit grating may also reduce the light utilization rate.

SUMMARY

An object of the present disclosure is to provide a slit grating and a method for manufacturing the same, so as to improve the light utilization rate, simplify the manufacturing process and reduce the production cost of the slit grating.

Another object of the present disclosure is to provide a display device including the above-mentioned slit grating and capable of being switched between a 2D display mode and a 3D display mode, so as to improve the light utilization rate of the slit grating.

In one aspect, the present disclosure provides a slit grating, including an upper substrate and a lower substrate arranged hermetically and oppositely to each other to form a cell, and a liquid composite layer arranged between the upper substrate and the lower substrate, wherein the liquid composite layer consists of a light-shielding liquid, through which the light cannot be transmitted, and a light-transmitting liquid, through which the light can be transmitted, incompatible with each other, a first transparent conductive layer, an insulating layer, a second transparent conductive layer and an electric-controlled dielectric layer are formed sequentially at an upper surface of the lower substrate, and the electric-controlled dielectric layer has an electrically-induced light-shielding-liquid-philic or light-shielding-liquid-phobic property, the second transparent conductive layer includes a plurality of parallel, bar-like electrodes, the electric-controlled dielectric layer includes a plurality of bar-like electric-controlled dielectric sublayers corresponding to regions where the bar-like electrodes are located, and the bar-like electrodes and the first transparent conductive layer are configured to control the respective bar-like electric-controlled dielectric sublayers to absorb or repel the light-shielding liquid.

In another aspect, the present disclosure provides a method for manufacturing the above-mentioned slit grating, including:

providing an upper substrate and a lower substrate;

forming a first transparent conductive layer, an insulating layer and a second transparent conductive layer at an upper surface of the lower substrate sequentially;

patterning the second transparent conductive layer so as to form a plurality of parallel, bar-like electrodes;

forming an electric-controlled dielectric layer having an electrically-induced light-shielding-liquid-philic or light-shielding-liquid-phobic property;

patterning the electric-controlled dielectric layer so as to form a plurality of bar-like electric-controlled dielectric sublayers corresponding to regions where the bar-like electrodes are located;

forming hermetical regions at the upper surface of the lower substrate;

forming a liquid composite layer within the hermetical region, the liquid composite layer consisting of a light-shielding liquid, through which the light cannot be transmitted, and a light-transmitting liquid, through which the light can be transmitted, incompatible with each other; and arranging the upper substrate and the lower substrate oppositely to each other to form a cell.

In yet another aspect, the present disclosure provides a 2D/3D switchable display device, including a display panel, the above-mentioned slit grating and a voltage controlling unit, wherein bar-like electrodes correspond to regions where pixel units of the display panel are located, and the voltage controlling unit is configured to apply voltages to the bar-like electrodes and a first transparent conductive layer so as to, in a 2D display mode, electrically induce bar-like electric-controlled dielectric sublayers to repel a light-shielding liquid and enable the light to be transmitted through the slit grating corresponding to the regions where the pixel units are located, and in a 3D display mode, electrically induce the bar-like electric-controlled dielectric sublayers corresponding to a part of the bar-like electrodes to absorb the light-shielding liquid to form light-shielding stripes, and electrically induce the bar-like electric-controlled dielectric sublayers corresponding to the other part of the bar-like electrodes to repel the light-shielding liquid to form light-transmitting stripes. The light-shielding stripes and the light-transmitting stripes are arranged at intervals.

The present disclosure has the following advantageous effects. According to the present disclosure, a liquid crystal layer is replaced with the liquid composite layer consisting of the light-shielding liquid and the light-transmitting liquid incompatible with each other, and the bar-like electric-controlled dielectric sublayers corresponding to the pixel units are provided, so as to control the distribution of the light-shielding liquid and the light-transmitting liquid by means of the electrically-induced light-shielding-liquid-philic or light-shielding-liquid-phobic property of the bar-like electric-controlled dielectric sublayers, thereby to form the slit grating during the 3D display and enable the regions corresponding to the pixel units of the display panel to be transparent completely during the 2D display. As a result, it is able to switch between the 2D display mode and the 3D display mode. Due to the absence of polarizers desired for the liquid crystal slit grating, it is able to improve the light utilization rate. Moreover, as compared with the liquid crystal slit grating, for the slit grating of the present disclosure, there is less demand on a liquid material layer and a cell thickness (a grating thickness), so it is able to simplify the manufacturing process, and reduce the production cost.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

Figure 1:
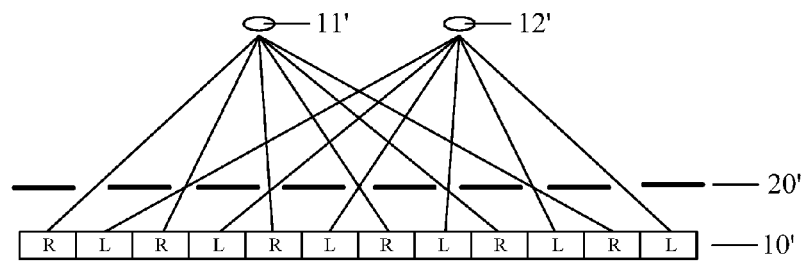
FIG. 1 is a schematic view showing the principle of autostereoscopic 3D display in the related art.
Figure 2:
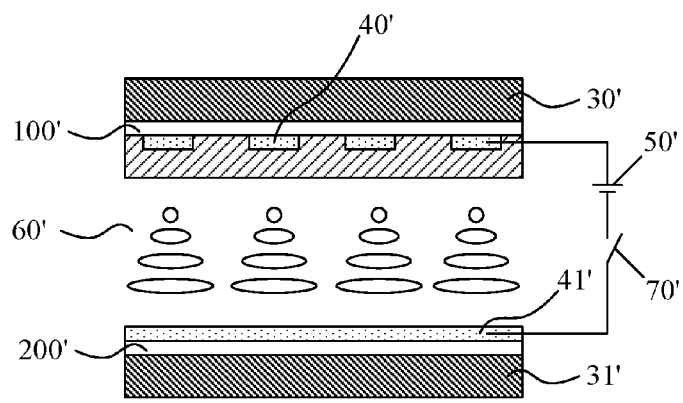
FIG. 2 is a schematic view showing a liquid crystal slit grating in the related art.
Figure 3:
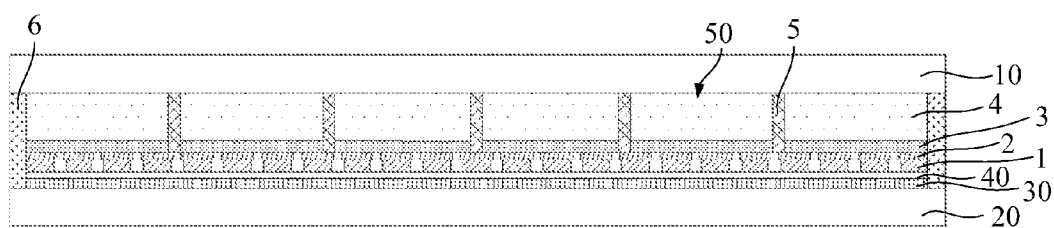
FIG. 3 is a schematic view showing a slit grating according to an embodiment of the present disclosure.
Figure 4:
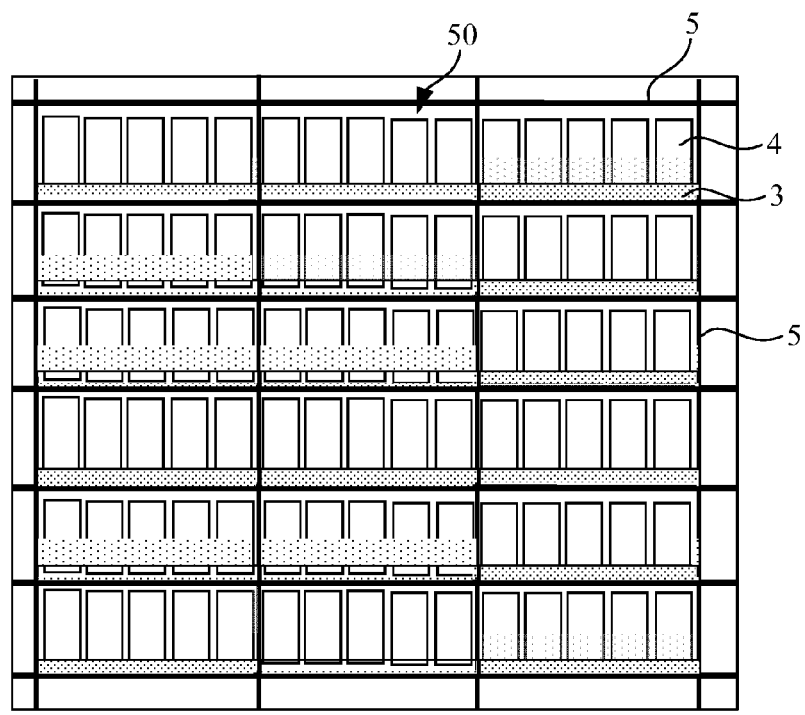
FIG. 4 is a top view of the slit grating according to an embodiment of the present disclosure during the 2D display.

It should be appreciated that, for the terms concerning the position relationship, such words as "upper" and "lower" will show the directions or positions with reference to FIG. 3, while such words as "horizontal" and "longitudinal" will show the directions or positions with reference to FIG. 4. However, these terms are merely used to facilitate the description hereinafter, but shall not be used to indicate or imply that the means or members must be positioned, constructed or operated in the specific directions, so they shall not be construed as limiting the present disclosure. In addition, such words as "first" and "second" are for illustrative purposes merely, but shall not be used to indicate or imply the importance.

Embodiment 1

As shown in FIGS. 3 and 4, a slit grating of the present disclosure includes an upper substrate 10 and a lower substrate 20 arranged hermetically and oppositely to each other to form a cell, and a liquid composite layer arranged between the upper substrate 10 and the lower substrate 20, in which the liquid composite layer consists of a light-shielding liquid 3 and a light-transmitting liquid 4 incompatible with each other. A first transparent conductive layer 30, an insulating layer 40, a second transparent conductive layer and an electric-controlled dielectric layer are formed sequentially at an upper surface of the lower substrate 20, and the electric-controlled dielectric layer has an electrically-induced light-shielding-liquid-philic or light-shielding-liquid-phobic property. The second transparent conductive layer includes a plurality of parallel, bar-like electrodes 1, and the electric-controlled dielectric layer includes a plurality of bar-like electric-controlled dielectric sublayers 2 corresponding to regions where the bar-like electrodes 1 are located. According to embodiments of the present disclosure, voltages are applied to the bar-like electrodes 1 and the first transparent conductive layer 30, so as to control the bar-like electric-controlled dielectric sublayers to absorb or repel the light-shielding liquid 3, thereby to control the distribution of the light-shielding liquid 3 and the light-transmitting liquid 4. To be specific, in a 3D display mode, the light-shielding liquid 3 and the light-transmitting liquid 4 are distributed in such a manner so as to form the slit grating, while in a 2D display mode, the light-shielding liquid 3 and the light-transmitting liquid 4 is distributed in such a manner so as to enable the light to be transmitted through regions corresponding to pixel units of a display panel.

The light-shielding liquid 3 may be a light-shielding ink, the light-transmitting liquid 4 may be transparent water, and the liquid composite layer is an oil-water mixed layer. The electric-controlled dielectric layer may include a material having lipophilic and lipophobic functional groups, e.g., a 16-mercaptohexadecanoic acid, with a lipophilic carbon chain as the lipophilic functional group and with —OH in a carboxyl group as the lipophobic function group. For the bar-like electric-controlled dielectric sublayers 2 including the 16-mercaptohexadecanoic acid, when an electric potential of the bar-like electrode 1 is positive, its lipophilic carbon chain is exposed, and the bar-like electric-controlled dielectric sublayers show lipophilicity and thus absorb the light-shielding liquid 3. When the electric potential of the bar-like electrode 1 is negative, the —OH group is exposed, the lipophilic carbon chain is hidden, and the bar-like electric-controlled dielectric sublayers show lipophobicity and thus repel the light-shielding liquid 3.

Of course, the light-shielding liquid 3 and the light-transmitting liquid 4 are not limited to a combination of oil and water, and a combination of any other liquids may also be used. At this time, the electric-controlled dielectric layer having the electrically-induced light-shielding-liquid-philic or light-shielding-liquid-phobic property may be selected correspondingly. In other words, the liquids are not particularly defined herein.

A working principle of the slit grating of the present disclosure includes controlling the bar-like electric-controlled dielectric sublayers 2 by means of the bar-like electrodes 1 and the first transparent conductive layer 30, so as to distribute the light-shielding liquid 3 and the light-transmitting liquid 4 in the following two modes.

1) 2D display mode, in which all the bar-like electric-controlled dielectric sublayers 2 are controlled by means of all the bar-like electrodes 1 and the first transparent conductive layer 30 so to repel the light-shielding liquid 3, and the light-transmitting liquid 4 is filled in the regions corresponding to the pixel units of the display panel so as to enable the light to be transmitted therethrough, thereby to achieve the 2D display.

2) 3D display mode, in which corresponding bar-like electric-controlled dielectric sublayers 2 are controlled by means of a part of the bar-like electrodes 1 and the first transparent conductive layer 30 so as to absorb the light-shielding liquid 3 and form light-shielding stripes, and corresponding bar-like electric-controlled dielectric sublayers 2 are controlled by means of the other part of the bar-like electrodes 1 and the first transparent conductive layer 30 so as to repel the light-shielding liquid 3, and then the light-transmitting liquid 4 takes the place of the light-shielding liquid 3 so as to form light-transmitting stripes (i.e., slits). The light-shielding stripes and the light-transmitting stripes are arranged at intervals. Hence, the light-shielding liquid 3 and the light-transmitting liquid 4 are distributed in such a manner so as to form the slit grating, thereby to achieve the 3D display.

Figure 5:
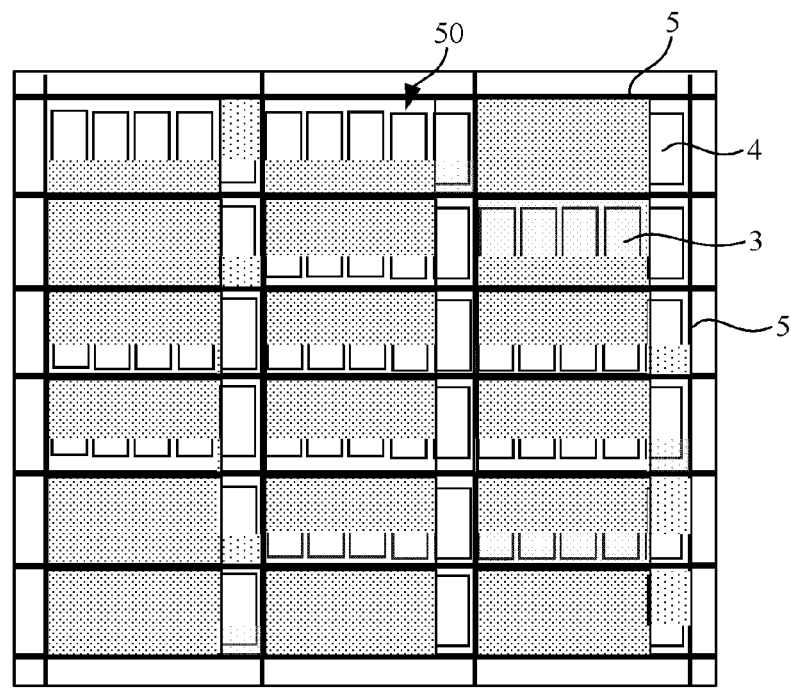
FIG. 5 is a bottom view showing the slit grating according to an embodiment of the present disclosure during the 3D display.
Figure 6:
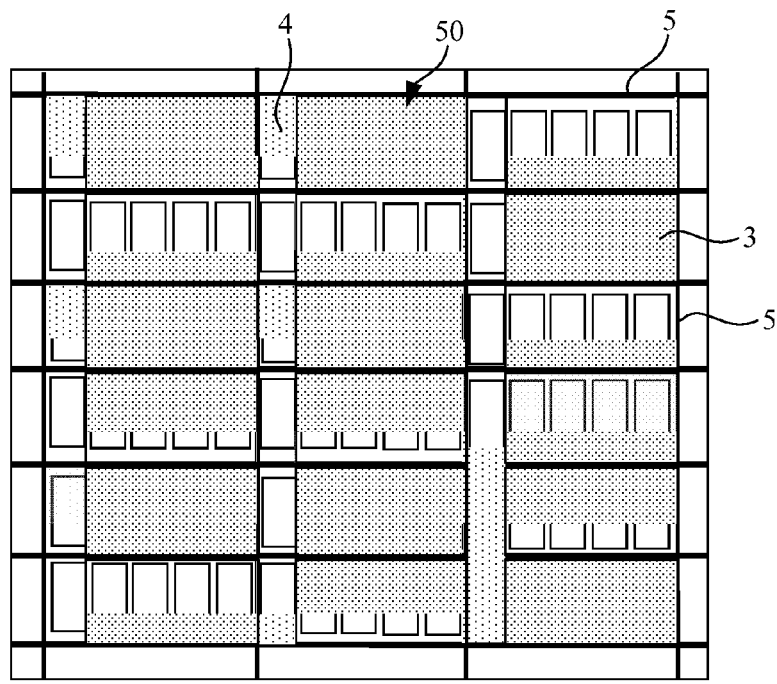
FIG. 6 is another top view showing the slit grating according to an embodiment of the present disclosure during the 3D display.

To be specific, for the bar-like electric-controlled dielectric sublayers 2 including the 16-mercaptohexadecanoic acid, when there are N viewpoints for the 3D display, an electric potential of the bar-like electrode 1 is negative every other (N−1) bar-like electrodes 1, the corresponding bar-like electric-controlled dielectric sublayers 2 repels the light-shielding liquid 3, and the light-transmitting liquid 4 takes the place of the light-shielding liquid 3 to form the light-transmitting stripes. Meanwhile, an electric potential of the other bar-like electrodes 1 is positive, and the corresponding bar-like electric-controlled dielectric sublayers 2 absorb the light-shielding liquid 3 to form the light-shielding stripes, as shown in FIGS. 5 and 6.

For the bar-like electric-controlled dielectric sublayers 2 made of the other materials, the working principle for the 2D and 3D display is identical to that of the bar-like electric-controlled dielectric sublayers 2 including the 16-mercaptohexadecanoic acid.

In this embodiment, a gap between the adjacent bar-like electric-controlled dielectric sublayers 2 has a width of 20 nm to 500 nm. As a result, in the 2D display mode, the normal 2D display may not be adversely affected even if the light-shielding liquid 3 is filled between the bar-like electric-controlled dielectric sublayers 2.

According to the slit grating of the present disclosure, a liquid crystal layer is replaced with the liquid composite layer consisting of the light-shielding liquid and light-transmitting liquid incompatible with each other, and the bar-like electric-controlled dielectric sublayers corresponding to the pixel units are provided, so as to control the distribution of the light-shielding liquid and the light-transmitting liquid by means of the electrically-induced light-shielding-liquid-philic or light-shielding-liquid-phobic property of the bar-like electric-controlled dielectric sublayers, thereby to form the slit grating in the 3D display mode and to enable the regions corresponding to the pixel units of the display panel to be transparent in the 2D display mode, and switch between the 2D display mode and the 3D display mode. Due to the absence of polarizers desired for the liquid crystal slit grating, it is able to improve the light utilization rate. Moreover, as compared with the liquid crystal slit grating, for the slit grating of the present disclosure, there is less demand on a liquid material layer and a cell thickness, so it is able to simplify the manufacturing process, and reduce the production cost.

In another example, a plurality of crisscross partitioning walls 5 are further provided at the upper surface of the lower substrate 20, so as to divide the upper surface thereof into a plurality of hermetical regions 50 in a matrix form. The liquid composite layer is separately filled within each hermetical region 50. The partitioning wall 5 corresponds to a region between the pixel units of the display panel, and the hermetical region 50 horizontally and longitudinally crosses at least one pixel unit. Due to the above-mentioned partitioned structure, it is able to reduce a coverage area of the liquid composite layer, thereby to shorten the time desired for changing the distribution mode of the light-shielding liquid 3 and the light-transmitting liquid 4 during the switch between the 2D and 3D display modes, and to accelerate the response time desired for the slit grating to switch between the 2D and 3D display modes.

When there are N viewpoints for the 3D display and the bar-like electrodes 1 extend in a longitudinal direction, the hermetical region 50 longitudinally crosses one or two pixel units and horizontally crosses N pixel units, in which N is usually of a value of 4 to 10.

It should be appreciated that, in the present disclosure, a direction in which a viewer stands when viewing an image is defined as the longitudinal direction, while an extension direction of a connecting line between the viewer's left and right eyes is defined as the horizontal direction. In order to achieve the 3D display, the light-shielding stripes (i.e., the slits) of the slit grating extend in the longitudinal direction.

During the actual application, when positions of the viewpoints for the 3D display change, it is required to adjust positions of the slits of the slit grating so as to ensure the 3D display quality, i.e., to change bright regions (i.e., light-transmitting regions) and dark regions (i.e., light-shielding regions) corresponding to the bar-like electric-controlled dielectric sublayers 2, as shown in FIGS. 5 and 6.

For this purpose, for example, the bar-like electrodes 1 and the bar-like electric-controlled dielectric sublayers 2 are arranged in a one-to-one correspondence manner, so that each bar-like electric-controlled dielectric sublayer 2 is controlled separately by the corresponding bar-like electrode 1, thereby to facilitate the adjustment of the slit positions of the slit grating and achieve the 3D display in a more flexible manner.

Alternatively, in order to achieve the 2D display, a density of the light-shielding liquid 3 is greater than a density of the light-transmitting liquid 4. When the display panel is used in an upright manner, the light-shielding liquid 3 is located below the light-transmitting liquid 3, i.e., at the bottom of the hermetical region 50, in the 2D display mode even if no voltage is applied to the bar-like electrodes 1 and the first transparent conductive layer 30, as shown in FIG. 4. At this time, because a light-shielding liquid layer is usually of a thickness of 10 μm to 20 μm, the light-shielding liquid layer may be merely arranged at a position corresponding to a region where gate lines or data lines of the display panel are located (i.e., a region where a black matrix is located) but does not overlap the pixel units, so as not to adversely affect the normal 2D display. Generally, a light-transmitting liquid layer is of a thickness three or four times than the light-shielding liquid layer.

Alternatively, in order to achieve the 2D display, the bar-like electric-controlled dielectric sublayer 2 consists of a plurality of electric-controlled dielectric blocks in one-to-one correspondence to the pixel units of the display panel. When the display panel is used in a non-upright manner, voltages are applied to the bar-like electrodes 1 and the first transparent conductive layer 30 so as to control the electric-controlled dielectric blocks to repel the light-shielding liquid 3, and to enable the light-shielding liquid to fill within a gap between the electric-controlled dielectric blocks and enable the light-transmitting liquid to take the place of the light-shielding liquid to form the light-transmitting region, i.e., to enable the light to be transmitted through the regions of the slit grating corresponding to the pixel units of the display panel, thereby to achieve the 2D display. When the display panel is used in the upright manner, the light-shielding liquid 3 is set to be of a density greater than that of the light-transmitting liquid 4, or no voltage is applied to the bar-like electrodes 1 and the first transparent conductive layer 30, so as to achieve the 2D display. At this time, the light-shielding liquid 3 is located at the bottom of the hermetical region 50, as shown in FIG. 4. The principle is identical to that mentioned above, and thus will not be repeated herein.

Alternatively, the upright gap between the electric-controlled dielectric blocks has a width of 20 μm to 50 μm. In order to store the liquids, the upright gap may be wider, and correspondingly a wider light-shielding region of the display panel cooperating therewith may be provided too, and as a result, the display effect may not be adversely affected. In the 2D display mode, the normal 2D display may not be adversely affected even if the gap between the electric-controlled dielectric blocks is filled with the light-shielding liquid 3.

Embodiment 2

Based on an identical inventive concept, embodiments of the present disclosure provide a method for manufacturing the slit grating of the Embodiment 1, which includes:

providing the upper substrate and the lower substrate;

forming the first transparent conductive layer, the insulating layer and the second transparent conductive layer at the upper surface of the lower substrate sequentially;

patterning the second transparent conductive layer so as to form a plurality of parallel, bar-like electrodes;

forming the electric-controlled dielectric layer having an electrically-induced light-shielding-liquid-philic or light-shielding-liquid-phobic property;

patterning the electric-controlled dielectric layer so as to form a plurality of bar-like electric-controlled dielectric sublayers corresponding to regions where the bar-like electrodes are located;

forming the hermetical regions at the upper surface of the lower substrate;

forming a liquid composite layer within the hermetical region, the liquid composite layer consisting of the incompatible light-shielding liquid and light-transmitting liquid; and arranging the upper substrate and the lower substrate oppositely to each other to form a cell.

According to the method of the present embodiment, a liquid crystal layer is replaced with the liquid composite layer consisting of the light-shielding liquid and the light-transmitting liquid incompatible witch each other, and the bar-like electric-controlled dielectric sublayers corresponding to the pixel units are provided, so as to control the distribution of the light-shielding liquid and the light-transmitting liquid by means of the electrically-induced light-shielding-liquid-philic or light-shielding-liquid-phobic property of the bar-like electric-controlled dielectric sublayers, thereby to form the slit grating in the 3D display mode and to enable the regions corresponding to the pixel units of the display panel to be transparent in the 2D display mode, and switch between the 2D display mode and the 3D display mode. Due to the absence of polarizers desired for the liquid crystal slit grating, it is able to improve the light utilization rate. Moreover, as compared with the liquid crystal slit grating, for the slit grating of the present disclosure, there is less demand on a liquid material layer and a cell thickness, so it is able to simplify the manufacturing process, and reduce the production cost.

In another example, the step of forming the hermetical regions at the upper surface of the lower substrate includes:

forming a hermetical layer on the bar-like electric-controlled dielectric sublayers; and patterning the hermetical layer so as to form a plurality of crisscross partitioning walls, thereby to divide the upper surface of the lower substrate into a plurality of hermetical regions in a matrix form.

The partitioning wall corresponds to a region between the pixel units of the display panel, and the hermetical region horizontally and longitudinally crosses at least one pixel unit. The hermetical layer may be made of organic resin. The patterns of the partitioning walls may be formed merely by an exposing and developing process, and as a result, the manufacturing process may be simplified.

Through the resultant partitioning walls, the liquid composite layer is filled separately within each hermetical region, so as to reduce the coverage area of the liquid composite layer. Due to the reduced coverage area of the liquid composite layer, it is able to shorten the time desired for changing the distribution mode of the light-shielding liquid and the light-transmitting liquid during the switch between the 2D and 3D display modes, thereby to accelerate the response time desired for the slit grating to switch between the 2D and 3D display modes.

Referring to FIG. 3, in a exemplary embodiment, the method for manufacturing the slit grating includes:

providing the upper substrate 10 and the lower substrate 20;

forming the first transparent conductive layer 30, the insulating layer 40 and the second transparent conductive layer on the lower substrate 20 sequentially;

applying a photoresist onto the second transparent conductive layer, exposing and developing the photoresist with a mask so as to form a photoresist reserved region corresponding to a region where the bar-like electrodes 1 are located and a photoresist unreserved region corresponding to the other regions, etching off the second transparent conductive layer at the photoresist unreserved region by a wet etching process, and removing the remaining photoresist, so as to form the bar-like electrodes 1;

forming the electric-controlled dielectric layer on the lower substrate 20 provided with the bar-like electrodes 1;

applying a photoresist onto the electric-controlled dielectric layer, exposing and developing the photoresist with a mask so as to form a photoresist reserved region corresponding to a region where the bar-like electric-controlled dielectric sublayers 2 are located and a photoresist unreserved region corresponding to the other regions, etching off the electric-controlled dielectric layer at the photoresist unreserved region by an etching process, and removing the remaining photoresist, so as to form the bar-like electric-controlled dielectric sublayers 2;

forming an organic resin layer on the lower substrate 20 provided with the bar-like electric-controlled dielectric sublayers 2;

exposing and developing the organic resin layer with a mask so as to form an organic resin reserved region, which forms the partitioning walls 5 for dividing the upper surface of the lower substrate 20 into a plurality of hermetical regions 50, and an organic resin unreserved region;

forming the liquid composite layer consisting of the incompatible light-shielding liquid 3 and light-transmitting liquid 4 within each hermetical region 50; and arranging the upper substrate 10 and the lower substrate 20 oppositely to each other to form a cell.

Alternatively, a sealant 6 may be provided at circumferences of the upper substrate 10 and the lower substrate 20.

Embodiment 3

A display device capable of being switched between a 2D display mode and a 3D display mode in this embodiment includes a display panel, the slit grating of the first embodiment, and a voltage controlling unit, in which the bar-like electrodes of the slit grating correspond to regions where the pixel units of the display panel are located;

the voltage controlling unit is configured to apply voltages to the bar-like electrodes and the first transparent conducive layer so as to, in a 2D display mode, electrically induce the bar-like electric-controlled dielectric sublayers to repel the light-shielding liquid and enable the light to be transmitted through regions of the slit grating corresponding to the regions where the pixel units of the display panel are located, and in a 3D display mode, electrically induce the bar-like electric-controlled dielectric sublayers corresponding to a part of the bar-like electrodes to absorb the light-shielding liquid to form the light-shielding stripes, and electrically induce the bar-like electric-controlled dielectric sublayers corresponding to the other part of the bar-like electrodes to repel the light-shielding liquid to form light-transmitting stripes. The light-shielding stripes and the light-transmitting stripes are arranged at intervals.

The partitioning walls of the slit grating correspond to the regions between the pixel units, and the hermetical region formed at the upper surface of the lower substrate by means of the partitioning wall horizontally and longitudinally crosses at least one pixel unit.

Alternatively, when there are N viewpoints for the 3D display mode and the bar-like electrode extends in a longitudinal direction, the hermetical region longitudinally crosses one or two pixel units, and horizontally crosses N pixel units, in which N is generally of a value of 4 to 10.

According to the display device of the present embodiment, the voltages are applied to the bar-like electrodes and the first transparent conductive layer by the voltage controlling unit, so as to control the bar-like electric-controlled dielectric sublayers corresponding to the bar-like electrodes to absorb or repel the light-shielding liquid, thereby to change the distribution of the incompatible light-shielding liquid and the light-transmitting liquid. In the 3D display mode, the light-shielding liquid and the light-transmitting liquid are distributed in such a manner so as to form the slit grating, while in the 2D display mode, the light-shielding liquid and the light-transmitting liquid are distributed in such a manner so as to enable the light to be transmitted through the regions corresponding to the pixel units of the display panel, thereby to obtain the 2D/3D switchable display device. Due to the absence of polarizers desired for the liquid crystal slit grating, it is able to improve the light utilization rate. Moreover, as compared with the liquid crystal slit grating, for the slit grating of the present disclosure, there is less demand on a liquid material layer and a cell thickness, so it is able to simplify the manufacturing process, and reduce the production cost.

Figure 7:
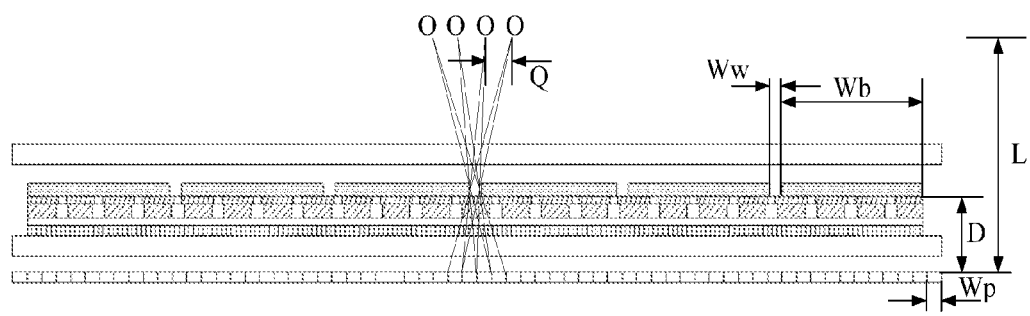
FIG. 7 is a schematic view showing the application of the slit grating in a display device according to an embodiment of the present disclosure.
Figure 8:
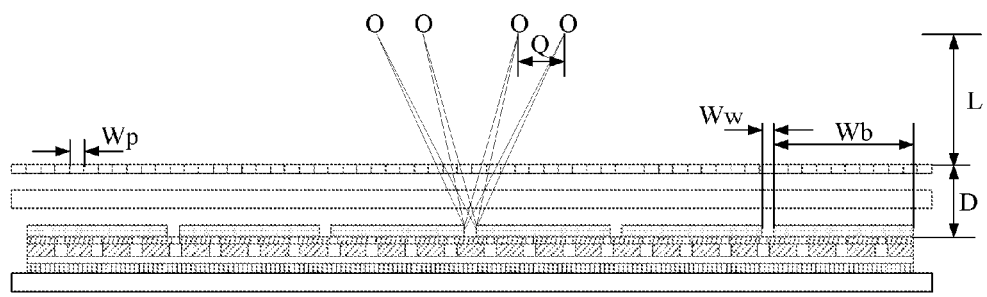
FIG. 8 is another schematic view showing the application of the slit grating in the display device according to an embodiment of the present disclosure.

During the actual application, for the display device without any backlight, e.g., an OLED display device, the slit grating is front-positioned at a display side of the display panel, as shown in FIG. 7. For the display device with a backlight, e.g., a liquid crystal display device, the slit grating may be front-positioned at the display side of the display panel, or rear-positioned between the display panel and the backlight, as shown in FIG. 8.

A design principle of the slit grating of the present disclosure is identical to that of the slit grating in related art. The design parameters include a width of the light-shielding stripe, a width of the light-transmitting stripe, a distance from the slit grating to the display panel, the number of viewpoints for the 3D display, a viewing distance, a width of the pixel unit, etc. The specific design may refer to the expressions for the slit grating in the related art.

For the front-positioned slit grating as shown in FIG. 7, the following expressions may be used:

$$D = \frac{W_p L}{Q + W_p}$$

$$W_w = \frac{Q W_p}{Q + W_p}$$

$$W_b = (N - 1) W_w,$$

while for the—rear-positioned slit grating as shown in FIG. 8, the following expressions may be used:

$$D = \frac{W_p L}{Q - W_p}$$

$$W_w = \frac{Q W_p}{Q - W_p}$$

$$W_b = (N - 1) W_w,$$

in which $W_p$ represents the width of the pixel unit, $W_b$ represents the width of the light-shielding stripe, $W_w$ represents the width of the light-transmitting stripe, D represents the distance from an upper surface of the display panel to an upper surface of the electric-controlled dielectric layer, L represents the viewing distance, N represents the number of the viewpoints O for the 3D display, and Q represents a pitch between the adjacent viewpoints O.

The above are merely the preferred embodiments of the present disclosure. It should be appreciated that, a person skilled in the art may make further improvements and substitutions without departing from the principle of the present disclosure, and these improvements and substitutions shall also fall within the scope of the present disclosure.

What is claimed is:

1. A slit grating comprising: an upper substrate and a lower substrate arranged hermetically and oppositely to each other to form a cell; and a liquid composite layer arranged between the upper substrate and the lower substrate, wherein:
   the liquid composite layer includes a light-shielding liquid and a light-transmitting liquid incompatible with each other,
   a first transparent conductive layer, an insulating layer, a second transparent conductive layer and an electric-controlled dielectric layer are formed sequentially at an upper surface of the lower substrate, and the electric-controlled dielectric layer has an electrically-induced light-shielding-liquid-philic or light-shielding-liquid-phobic property,
   the second transparent conductive layer comprises a plurality of parallel bar-like electrodes, the electric-controlled dielectric layer comprises a plurality of bar-like electric-controlled dielectric sublayers corresponding to regions where the bar-like electrodes are located, and the bar-like electrodes and the first transparent conductive layer are configured to control the respective bar-like electric-controlled dielectric sublayers to absorb or repel the light-shielding liquid,
   a plurality of crisscross partitioning walls are formed at the upper surface of the lower substrate so as to divide the upper surface of the lower substrate into a plurality of hermetical regions in a matrix form, and the liquid composite layer is filled within each hermetical region,
   the first transparent conductive layer and the plurality of parallel bar-like electrodes are arranged at an identical side of the plurality of hermetical regions away from the upper substrate, and the first transparent conductive layer arranged at the identical side of the plurality of hermetical regions away from the upper substrate is insulated from the plurality of parallel bar-like electrodes, and
   the bar-like electric-controlled dielectric sublayer consists of a plurality of electric-controlled dielectric blocks separated from each other, and each hermetical region is provided with a plurality of electric-controlled dielectric blocks.

2. The slit grating according to claim 1, wherein a density of the light-shielding liquid is greater than a density of the light-transmitting liquid.

3. The slit grating according to claim 1, wherein the bar-like electric-controlled dielectric sublayer includes a plurality of separate electric-controlled dielectric blocks, and an upright gap between adjacent electric-controlled dielectric blocks of the plurality of separate electric-controlled dielectric blocks is of a width of 20 μm to 50 μm.

4. The slit grating according to claim 1, wherein the bar-like electrodes are arranged at positions in one-to-one correspondence to the bar-like electric-controlled dielectric sublayers.

5. The slit grating according to claim 1, wherein a gap between the bar-like electric-controlled dielectric sublayers is of a width of 20 nm to 500 nm.

6. The slit grating according to claim 1, wherein the light-shielding liquid is a light-shielding ink, the light-transmitting liquid is water, and the electric-controlled dielectric layer comprises a material having a lipophilic functional group and a lipophobic functional group.

7. The slit grating according to claim 6, wherein the electric-controlled dielectric layer comprises a 16-mercaptohexadecanoic acid.

8. A display device capable of being switched between a 2D display mode and a 3D display mode, comprising a display panel, the slit grating according to claim 1, and a voltage controlling unit,
   wherein bar-like electrodes correspond to regions where pixel units of the display panel are located, and
   the voltage controlling unit is configured to apply voltages to the bar-like electrodes and a first transparent conductive layer so as to, in a 2D display mode, electrically induce bar-like electric-controlled dielectric sublayers to repel a light-shielding liquid and enable the light to be transmitted through the slit grating corresponding to the regions where the pixel units are located, and in a 3D display mode, electrically induce the bar-like electric-controlled dielectric sublayers corresponding to a first part of the bar-like electrodes to absorb the light-shielding liquid to form light-shielding stripes, and electrically induce the bar-like electric-controlled dielectric sublayers corresponding to a second part of the bar-like electrodes to repel the light-shielding liquid to form light-transmitting stripes, and the light-shielding stripes and the light-transmitting stripes are arranged at intervals.

9. The display device according to claim 8, wherein the partitioning wall corresponds to a region between the pixel units, and the hermetical region horizontally and longitudinally crosses at least one pixel unit.

10. The display device according to claim 9, wherein the bar-like electrodes extend in a longitudinal direction, and the hermetical region longitudinally crosses one or two pixel units and horizontally crosses four to ten pixel units.

11. The display device according to claim 8, wherein the display device is an OLED display device, and the slit grating is front-positioned at a display side of the display panel.

12. The display device according to claim 8, wherein the display device is a liquid crystal display device and further comprises a backlight, and the slit grating is front-positioned at a display side of the display panel, or rear-positioned between the display panel and the backlight.

13. The slit grating according to claim 1, wherein the partitioning walls are between the electric-controlled dielectric layer and the upper substrate, and the first and the second transparent conductive layers are at a side of the partitioning walls away from the upper substrate.

14. A method for manufacturing a slit grating, wherein the slit grating comprises:
an upper substrate and a lower substrate arranged hermetically and oppositely to each other to form a cell; and a liquid composite layer arranged between the upper substrate and the lower substrate, wherein:
the liquid composite layer includes a light-shielding liquid and a light-transmitting liquid incompatible with each other,
a first transparent conductive layer, an insulating layer, a second transparent conductive layer and an electric-controlled dielectric layer are formed sequentially at an upper surface of the lower substrate, and the electric-controlled dielectric layer has an electrically-induced light-shielding-liquid-philic or light-shielding-liquid-phobic property,
the second transparent conductive layer comprises a plurality of parallel bar-like electrodes, the electric-controlled dielectric layer comprises a plurality of bar-like electric-controlled dielectric sublayers corresponding to regions where the bar-like electrodes are located, and the bar-like electrodes and the first transparent conductive layer are configured to control the respective bar-like electric-controlled dielectric sublayers to absorb or repel the light-shielding liquid,
a plurality of crisscross partitioning walls are formed at the upper surface of the lower substrate so as to divide the upper surface of the lower substrate into a plurality of hermetical regions in a matrix form, and the liquid composite layer is filled within each hermetical region,
the first transparent conductive layer and the plurality of parallel bar-like electrodes are arranged at an identical side of the plurality of hermetical regions away from the upper substrate, and the first transparent conductive layer arranged at the identical side of the plurality of hermetical regions away from the upper substrate is insulated from the plurality of parallel bar-like electrodes, and
the bar-like electric-controlled dielectric sublayer consists of a plurality of electric-controlled dielectric blocks separated from each other, and each hermetical region is provided with a plurality of electric-controlled dielectric blocks;
wherein the method comprises:
providing the upper substrate and the lower substrate;
forming the first transparent conductive layer, the insulating layer and the second transparent conductive layer at the upper surface of the lower substrate sequentially;
patterning the second transparent conductive layer so as to form a plurality of parallel, bar-like electrodes;
forming the electric-controlled dielectric layer having an electrically-induced light-shielding-liquid-philic or light-shielding-liquid-phobic property;
patterning the electric-controlled dielectric layer so as to form a plurality of bar-like electric-controlled dielectric sublayers corresponding to regions where the bar-like electrodes are located;
forming the hermetical regions at an upper surface of the electric-controlled dielectric layer;
forming the liquid composite layer within the hermetical region, the liquid composite layer including the light-shielding liquid and the light-transmitting liquid incompatible with each other; and
arranging the upper substrate and the lower substrate oppositely to each other to form a cell.

15. The method according to claim 14, wherein the step of forming the hermetical regions at the upper surface of the lower substrate comprises:
forming a hermetical layer on the bar-like electric-controlled dielectric sublayers; and
patterning the hermetical layer so as to form a plurality of crisscross partitioning walls for dividing the upper surface of the lower substrate into a plurality of hermetical regions in a matrix form.

16. The method according to claim 15, wherein the hermetical layer is made of organic resin.

17. A display device capable of being switched between a 2D display mode and a 3D display mode, comprising: a display panel; a slit grating; and a voltage controlling unit, wherein:
the slit grating comprises an upper substrate and a lower substrate arranged hermetically and oppositely to each other to form a cell, and a liquid composite layer arranged between the upper substrate and the lower substrate,
the liquid composite layer includes a light-shielding liquid and a light-transmitting liquid incompatible with each other,
a first transparent conductive layer, an insulating layer, a second transparent conductive layer and an electric-controlled dielectric layer are formed sequentially at an upper surface of the lower substrate, and the electric-controlled dielectric layer has an electrically-induced light-shielding-liquid-philic or light-shielding-liquid-phobic property, and
the second transparent conductive layer comprises a plurality of parallel bar-like electrodes, the electric-controlled dielectric layer comprises a plurality of bar-like electric-controlled dielectric sublayers corresponding to regions where the bar-like electrodes are located, and the bar-like electrodes and the first transparent conductive layer are configured to control the respective bar-like electric-controlled dielectric sublayers to absorb or repel the light-shielding liquid,
the bar-like electrodes correspond to regions where pixel units of the display panel are located,
the voltage controlling unit is configured to apply voltages to the bar-like electrodes and a first transparent conducive layer so as to, in a 2D display mode, electrically induce bar-like electric-controlled dielectric sublayers to repel a light-shielding liquid and enable the light to be transmitted through the slit grating corresponding to the regions where the pixel units are located, and in a 3D display mode, electrically induce the bar-like electric-controlled dielectric sublayers corresponding to a first part of the bar-like electrodes to absorb the light-shielding liquid to form light-shielding stripes, and electrically induce the bar-like electric-controlled dielectric sublayers corresponding to a second part of the bar-like electrodes to repel the light-shielding liquid to form light-transmitting stripes, and the light-shielding stripes and the light-transmitting stripes are arranged at intervals, and
a plurality of crisscross partitioning walls are formed at the upper surface of the lower substrate so as to divide the upper surface of the lower substrate into a plurality of hermetical regions in a matrix form, and the liquid composite layer is filled within each hermetical region,
the first transparent conductive layer and the plurality of parallel bar-like electrodes are arranged at an identical side of the plurality of hermetical regions away from the upper substrate, and the first transparent conductive layer arranged at the identical side of the plurality of hermetical regions away from the upper substrate is insulated from the plurality of parallel bar-like electrodes, and the bar-like electric-controlled dielectric sublayer consists of a plurality of electric-controlled dielectric blocks separated from each other, each hermetical region is provided with a plurality of electric-controlled dielectric blocks, and the electric-controlled dielectric blocks in each hermetical region are in one-to-one correspondence to the pixel units of the display panel.

* * * * *